(12) United States Patent
Roshardt

(10) Patent No.: US 6,997,757 B2
(45) Date of Patent: Feb. 14, 2006

(54) ELECTRICAL CONTACT PIN CARRYING A CHARGE OF SOLDER AND PROCESS FOR PRODUCING IT

(75) Inventor: Christophe Roshardt, Thorigny sur Marne (FR)

(73) Assignee: SM Contact, Quincy Voisins (FR)

( * ) Notice: Subject to any disclaimer, the term of this patent is extended or adjusted under 35 U.S.C. 154(b) by 0 days.

(21) Appl. No.: 10/874,230

(22) Filed: Jun. 24, 2004

(65) Prior Publication Data

US 2006/0014443 A1   Jan. 19, 2006

(51) Int. Cl.
*H01R 13/42* (2006.01)
(52) U.S. Cl. .......................... 439/751; 439/876
(58) Field of Classification Search ............... 439/876, 439/83, 751; 228/180.1, 255, 253
See application file for complete search history.

(56) References Cited

U.S. PATENT DOCUMENTS

| 3,780,433 | A |   | 12/1973 | Lynch |
| 3,864,014 | A |   | 2/1975  | Lynch |
| 3,977,075 | A |   | 8/1976  | Lynch et al. |
| 4,017,142 | A | * | 4/1977  | Clark et al. ................. 439/870 |
| 4,469,394 | A |   | 9/1984  | Verhoeven |
| 5,029,748 | A | * | 7/1991  | Lauterbach et al. ...... 228/180.1 |
| 6,402,531 | B1| * | 6/2002  | Legrady ...................... 439/83 |

* cited by examiner

*Primary Examiner*—J. F. Duverne
(74) *Attorney, Agent, or Firm*—Stevens, Davis, Miller & Mosher, LLP

(57) ABSTRACT

According to the invention, said charge of solder is in the form of a ring (9) crimped onto to said pin (1), coaxially with the latter.

5 Claims, 2 Drawing Sheets

ELECTRICAL CONTACT PIN CARRYING A CHARGE OF SOLDER AND PROCESS FOR PRODUCING IT

The present invention relates to an electrical contact pin carrying a charge of solder. It also relates to a process for producing said pin.

Already known, in particular in the field of printed circuits, are electrical contact pins carrying a charge of solder for making it easier and more reliable to solder said pins to a printed-circuit board provided with holes into which said pins are inserted.

Such pins are described, for example, in documents U.S. Pat. No. 3,780,433, U.S. Pat. No. 3,864,014, U.S. Pat. No. 3,977,075 and U.S. Pat. No. 4,469,394.

In these known pins, the charge of solder is attached to said pins either by applying a drop of molten solder or by forcibly inserting lengths of solder wire into longitudinal housings.

Such processes are not easy to implement and very difficult to use in automatic machines for the continuous production of said pins.

The object of the present invention is to remedy these drawbacks.

For this purpose, according to the invention, the electrical contact pin carrying a charge of solder is noteworthy in that said charge of solder is in the form of a ring crimped onto to said pin, coaxially with the latter.

A process for producing the pin according to the invention may consist of the following:
 said charge of solder is produced in the form of a piece having at least approximately the shape of a staple;
 said piece is placed around said pin; and
 said piece is crimped around said pin in order to form a ring firmly fixed to said pin.

Thus, the process of forming the charge of solder on the electrical contact pin comprises only two mechanical operations (namely the placing of the staple around the pin and the crimping of said staple) that can be easily incorporated into the pin manufacturing process by an automatic machine.

Preferably, to ensure that the staple-shaped piece of solder is properly held on the pin, a surface irregularity is formed, on said pin, at the place where said piece of solder is attached and crimped. Such a surface irregularity may be in the form of a recess and/or in the form of a raised feature, and it is preferably obtained by stamping said pin.

The figures of the appended drawing will make it clearly understood how the invention can be realized. In these figures, identical references denote similar elements.

Figure 1:
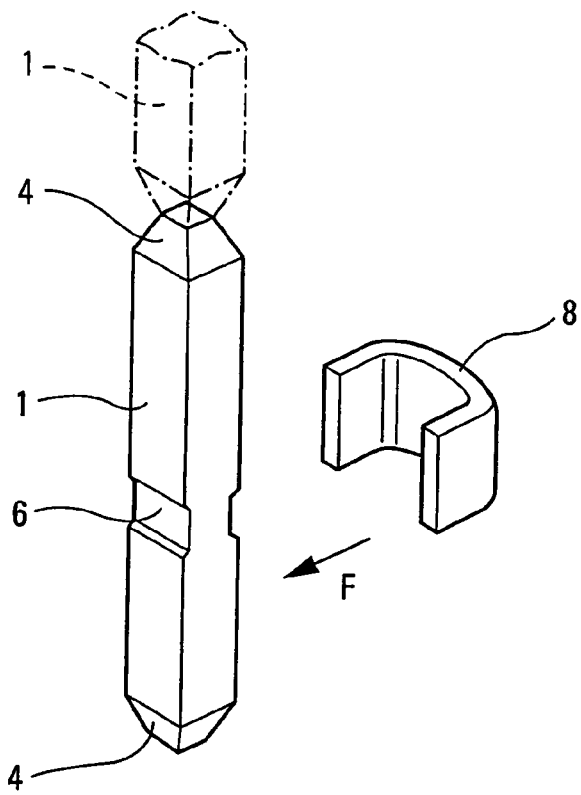
FIGS. 1 and 2 illustrate, in enlarged perspective, an example of an electrical contact pin according to the present invention, respectively before and after the charge of solder has been fastened to said pin.
Figure 3:
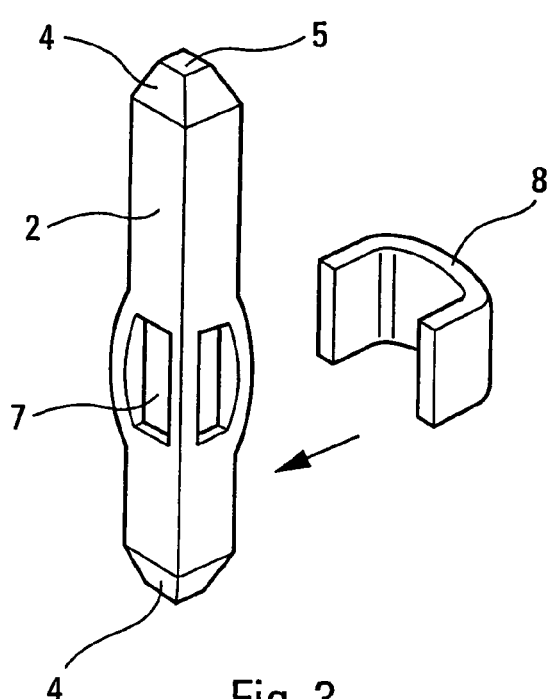
FIGS. 3 and 4 illustrate, in enlarged perspective, another example of the electrical contact pin according to the present invention, respectively before and after the charge of solder has been fastened to said pin.

The electrical contact pins 1 and 2, shown by FIGS. 1 and 3 respectively, are for example produced, in a known manner, from a continuous wire, in which the pins form an uninterrupted series, as illustrated by the dot/dash lines in FIG. 1. Also in a known manner, each pin 1 or 2 of the series is bounded, with respect to the previous pin and to the following pin, by regions 4 of lower strength that are obtained by stamping and can be easily broken at reduced sections 5.

According to one particular characteristic of the present invention, during stamping of the regions 4 of lower strength, surface irregularities 6 or 7, in the form of recesses and/or raised features, are also stamped in the intermediate part of said pins 1 or 2.

Moreover, also according to the present invention, charges of solder 8 having at least the approximate shape of a staple are prepared independently of the production of said pins 1 and 2.

As illustrated by the arrows F in FIGS. 1 and 3, a staple-shaped charge of solder 8 is then attached to each pin 1 or 2, around the latter, at said surface irregularities in the form of recesses 6 and/or raised features 7.

Figure 2:
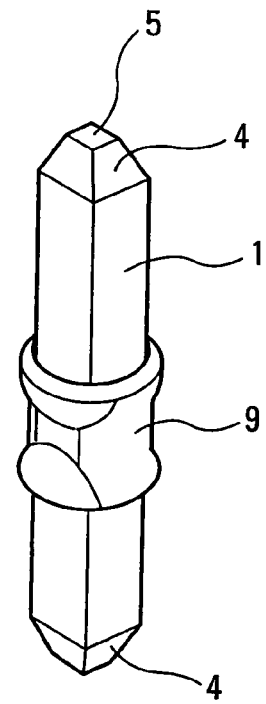
Figure 4:
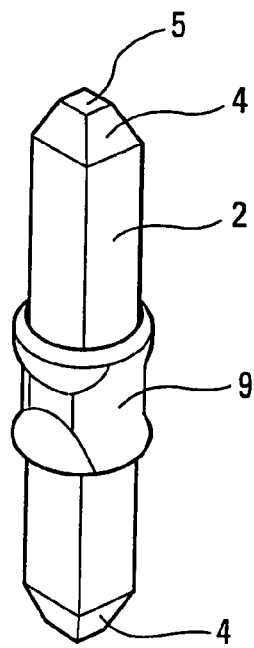

Next, each charge of solder 8 thus attached around said surface irregularities is crimped around the corresponding pin 1 or 2 in order to form a solder ring 9 in the form of a collar, which is fastened thereto as shown by FIGS. 2 and 4.

It will be readily understood that the placing and crimping of the charges of solder 8 on to the pins 1 or 2 are two simple mechanical operations, easy to implement in the process for manufacturing said pins 1 or 2.

It should also be pointed out that the staple-shaped charges of solder 8 may be formed in order to correspond exactly to the optimum amount of solder for the soldering operation to be carried out and that the crimping operation is easy since the charge of solder 8 consists of tin or a similar metal alloy and therefore is very malleable.

By implementing the process according to the invention, the composite pins 1, 9 or 2, 9, illustrated respectively by FIGS. 2 and 4, are obtained.

Figure 5:
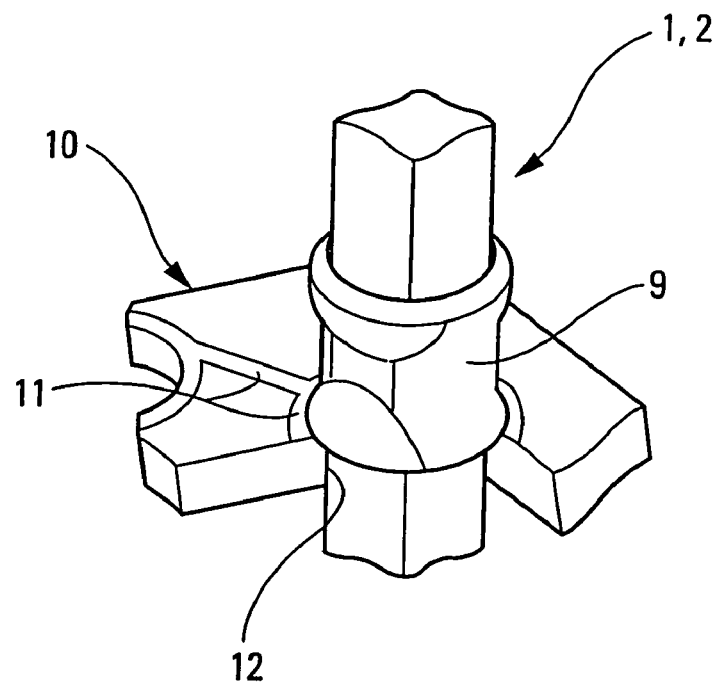
FIGS. 5 and 6 illustrate, in enlarged perspective, an example of a process for fastening the pin of FIG. 2 or FIG. 4 to a printed-circuit board, shown in part, before and after soldering respectively.
Figure 6:
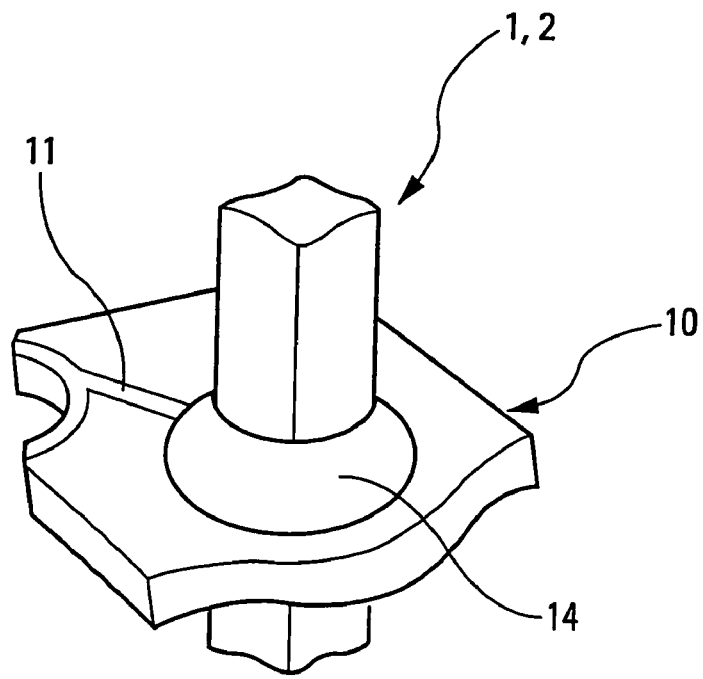

Illustrated in FIGS. 5 and 6 is the soldering of these composite pins to a printed-circuit board 10, having conducting tracks 11 connected to a plated-through hole 12.

In the example shown, the composite pin 1, 9 or 2, 9 is inserted into the plated-through hole 12 until the solder ring 9 comes into contact with said board 10. Of course, the solder ring 9 and the plated-through hole 12 could be designed so that said ring penetrates into said hole.

From this position, illustrated by FIG. 5, a thermal process capable of melting the solder ring 9 is actuated in order to form the solder joint 14 between said pin 1, 2 and the board 10.

In the foregoing, it will be readily understood that the composite pins 1, 9 and 2, 9 may be produced economically and reliably, in particular owing to the fact that the charge of solder may be attached to each pin by crimping as it leaves the stamping machine and at the same rate, without the consequence of prejudicing the rate of production of the pins.

Delivered, for example, in the form of continuous reels, the composite pins with a charge of solder according to the invention are just as easy to use as the conventional pins without a charge, and they may be fitted using existing insertion machines.

Of course, the present invention is not limited to pins manufactured as a continuous series: the composite pins 1, 9 and 2, 9 may in fact be in loose form, or arranged in parallel on a carrier tape, or else in any other form of presentation known in the art.

Furthermore, although the present invention was described above more especially in relation to pins for connection devices, it goes without saying it is not limited to this type of pin, but, on the contrary, it can apply to other types, such as for example, pins formed by the connection leads of electronic components.

What is claimed is:

1. A process for producing an electrical contact pin carrying a charge of solder, comprising:
   producing said charge of solder in the form of a piece having at least approximately the shape of a staple;
   placing said piece around said pin by moving said piece transversely to said pin; and
   crimping said piece around said pin in order to form a ring firmly fixed to said pin.

2. The process as claimed in claim 1, in which a surface irregularity is formed on said pin at the place where said piece of solder is attached and crimped.

3. The process as claimed in claim 2, in which said surface irregularity is in the form of a recess.

4. The process as claimed in claim 2, in which said surface irregularity is in the form of a raised feature.

5. The process as claimed in claim 2, in which said surface irregularity is obtained by stamping.

* * * * *